US010922950B2

(12) United States Patent
Severac et al.

(10) Patent No.: US 10,922,950 B2
(45) Date of Patent: Feb. 16, 2021

(54) RELAY WITH AN INTERMEDIATE ALERT MECHANISM

(71) Applicant: Schneider Electric Logistics Asia Pte Ltd., Singapore (SG)

(72) Inventors: Didier Severac, Techpoint (SG); Shu Xing Hong, Singapore (SG)

(73) Assignee: Schneider Electric Logistics Asia Pte Ltd., Singapore (SG)

( * ) Notice: Subject to any disclaimer, the term of this patent is extended or adjusted under 35 U.S.C. 154(b) by 0 days.

(21) Appl. No.: 13/655,702

(22) Filed: Oct. 19, 2012

(65) Prior Publication Data

US 2013/0314237 A1 Nov. 28, 2013

(30) Foreign Application Priority Data

Oct. 21, 2011 (SG) ............................... 201107781-5

(51) Int. Cl.
| | |
|---|---|
| *G08B 21/00* | (2006.01) |
| *G08B 21/18* | (2006.01) |
| *G01R 31/327* | (2006.01) |
| *H01H 47/02* | (2006.01) |
| *H02H 3/00* | (2006.01) |

(Continued)

(52) U.S. Cl.
CPC ....... *G08B 21/182* (2013.01); *G01R 31/3274* (2013.01); *G01R 31/3278* (2013.01); *H01H 47/02* (2013.01); *H02H 3/006* (2013.01); *H02H 3/04* (2013.01); *H01H 50/08* (2013.01)

(58) Field of Classification Search
CPC ... F02D 41/20; G01R 31/3274; G08B 21/182; H01H 47/325; H01H 47/002; H01H 47/02; H01H 45/00–61/08

USPC .......................... 340/635–664; 361/139–210
See application file for complete search history.

(56) References Cited

U.S. PATENT DOCUMENTS

| | | | | |
|---|---|---|---|---|
| 5,115,226 | A | * | 5/1992 | Schweitzer, III .... H02H 1/0061 307/152 |
| 5,654,896 | A | * | 8/1997 | Ochi ....................... 324/764.01 |
| 5,751,536 | A | | 5/1998 | Haddad et al. |

(Continued)

FOREIGN PATENT DOCUMENTS

EP           0 949 734          10/1999

OTHER PUBLICATIONS

Search Report (pp. 1-4) dated Jul. 17, 2014 by Intellectual Property Office of Singapore in counterpart priority Singapore Application No. 201107781-5.

(Continued)

*Primary Examiner* — Julie B Lieu

(74) *Attorney, Agent, or Firm* — David V. Rossi; Haug Partners LLP

(57) ABSTRACT

A relay with an intermediate alert mechanism and a method for producing an intermediate alert in association with a relay. The relay comprises an input sampling module configured to detect a parameter of a source to be monitored; a processing module configured to determine a working range based on a threshold level and a working condition, and the processing module further configured to automatically determine at least one intermediate level within the working range based on the threshold level. The processing module causes the transmission of an intermediate trigger signal when the detected value of the parameter reaches the intermediate level.

20 Claims, 6 Drawing Sheets

(51) Int. Cl.
*H02H 3/04* (2006.01)
*H01H 50/08* (2006.01)

(56) References Cited

U.S. PATENT DOCUMENTS

| | | | |
|---|---|---|---|
| 6,167,329 A | 12/2000 | Engel et al. | |
| 6,172,862 B1* | 1/2001 | Jonnatti | H02H 1/0015 |
| | | | 340/647 |
| 6,556,661 B1 | 4/2003 | Ingalsbe et al. | |
| 2009/0109021 A1* | 4/2009 | Paoletti et al. | 340/540 |
| 2009/0115620 A1* | 5/2009 | Hunter | H02H 3/006 |
| | | | 340/664 |
| 2009/0231153 A1* | 9/2009 | Hauenstein et al. | 340/683 |
| 2012/0293333 A1* | 11/2012 | Roy Trudel | H01H 9/0005 |
| | | | 340/632 |
| 2018/0226830 A1* | 8/2018 | Hsu | H02J 7/04 |

OTHER PUBLICATIONS

Written Opinion (pp. 1-8) dated Jul. 17, 2014 by Intellectual Property Office of Singapore in counterpart priority Singapore Application No. 201107781-5.

* cited by examiner

RELAY WITH AN INTERMEDIATE ALERT MECHANISM

CROSS-REFERENCE TO RELATED APPLICATIONS

This application is based upon and claims the benefit of priority from the corresponding Singapore Patent Application No. 201107781-5, filed Oct. 21, 2011, which is incorporated herein by reference in its entirety.

TECHNICAL FIELD

The present disclosure relates broadly to a relay with an intermediate alert mechanism and to a method for producing an intermediate alert in association with a relay.

BACKGROUND

In the electronics industry, devices such as relays are typically used to operate machinery and circuits. Such devices typically rely on energisation or switching on/off for operations.

For monitoring or control operations using a control relay, typically, the relay monitors parameters that has been set by a user. Parameters may include nominal operating voltage range, over voltage limit, under voltage limit, time delay, phase asymmetry threshold etc. The parameters are calculated from a desired working/operating condition monitored by the relay. For example, if a working condition of a power supply is taken as 240V, an overvoltage tolerance of 5%, that has been set by the user, causes the relay to calculate an overvoltage limit of 252V such that the relay switches on/off when the monitored voltage level meets the calculated limit. As a further example, if a user sets a voltage range to 400V, an under-voltage limit to 300V, an over-voltage limit to 440V, an asymmetry limit to 30V and a time-setting to 5 seconds, this would instruct the relay to monitor a physical input parameter of a source on whether the parameter is less than 300V or more than 440V, or the difference of voltage between 3-phase leads is more than 30V. If any condition is met, the relay de-energizes after delaying for a time-delay of 5 seconds.

However, one problem arises in that the user typically only knows of a fault when the relay switches on/off. That is, the user does not have prior information or feedback on the status of the parameters being monitored, e.g. for taking pre-emptive measures. There have also been instances of erroneous reports in scenarios whereby the parameter is already not fulfilling the conditions set by the user.

The present disclosure is directed to a relay with an intermediate alert mechanism and a method for intermediate alerting in association with a relay that seek to mediate certain disadvantages associated with the conventional relays.

SUMMARY

In accordance with a first aspect according to some embodiments as set forth in the present disclosure, there is provided a relay comprising an input sampling module configured to detect a value of a parameter of the source to be monitored; a processing module configured to determine a working range based on a threshold level and a working condition, and the processing module further configured to automatically determine at least one intermediate level within the working range based on the threshold level; and wherein the processing module causes the transmission of an intermediate trigger signal when the detected value of the parameter reaches the intermediate level.

According to some embodiments as set forth in the present disclosure, the parameter comprises one or more parameter selected from a group consisting of three phase voltage, single phase voltage, single phase current, phase angle, phase frequency, power, temperature, resistance, and digital signals.

According to some embodiments as set forth in the present disclosure, the intermediate trigger signal produces an alert. The alert may comprise a visual alert, an audio alert or both. The visual alert may comprise lights illuminated by a light emitting diode (LED).

According to some embodiments as set forth in the present disclosure, the threshold level is set by a user.

According to some embodiments as set forth in the present disclosure, the working condition is set based on an instructional input.

According to some embodiments as set forth in the present disclosure, the instructional input is based on a user activation.

According to some embodiments as set forth in the present disclosure, the instructional input is based on a powering up of the relay.

According to some embodiments as set forth in the present disclosure, the processing module is capable of instructing transmission of a trigger signal from the relay if the detected value of the parameter is outside the working range.

According to some embodiments as set forth in the present disclosure, the relay comprises a switch element, and wherein the transmitting of the trigger signal comprises switching on/off the switch element of the relay.

According to some embodiments as set forth in the present disclosure, the processing module is capable of automatically setting a plurality of intermediate levels.

In accordance with a second aspect according to some embodiments as set forth in the present disclosure, there is provided a method for intermediate alerting in association with a relay, the method comprising detecting a parameter of a source to be monitored; determining a working range based on a threshold level and a working condition; automatically determining at least one intermediate level within the working range based on the threshold level; and transmitting an intermediate trigger signal when the detected value of the parameter reaches the intermediate level.

According to some embodiments as set forth in the present disclosure, the parameter comprises one or more parameter selected from a group consisting of three phase voltage, single phase voltage, single phase current, phase angle, phase frequency, power, temperature, resistance, and digital signals.

According to some embodiments as set forth in the present disclosure, the intermediate trigger signal produces an alert. The alert may comprise a visual alert, an audio alert or both. The visual alert may comprise lights illuminated by a light emitting diode (LED).

According to some embodiments as set forth in the present disclosure, the threshold level is set by a user.

According to some embodiments as set forth in the present disclosure, the method comprises setting the working condition based on an instructional input.

According to some embodiments as set forth in the present disclosure, the instructional input is based on a user activation.

According to some embodiments as set forth in the present disclosure, the instructional input is based on a powering up of the relay.

According to some embodiments as set forth in the present disclosure, the method comprises transmitting a trigger signal from the relay if the detected value of the parameter is outside the working range.

According to some embodiments as set forth in the present disclosure, the transmitting the trigger signal comprises switching on/off a switch element of the relay.

According to some embodiments as set forth in the present disclosure, the automatically setting step comprises automatically setting a plurality of intermediate levels within the working range based on the threshold level.

In accordance with a third aspect according to some embodiments as set forth in the present disclosure, there is provided a non-transitory computer readable data storage medium having stored thereon computer code means for instructing a processing module of a relay to execute the above-disclosed method for producing an intermediate alert associated with a relay.

It is understood that the foregoing summary is representative of some embodiments of the invention, and is neither representative nor inclusive of all subject matter and embodiments within the scope of the present disclosure. It is further understood that in the foregoing summary references to various features being preferable and/or being comparatively preferable (e.g., more preferably, even more preferably, etc.) are applicable to various embodiments or implementations and do not imply that such preferences and/or comparative preferences are applicable to all embodiments, and thus should not be limiting or restrictive of the present invention as claimed. Additionally, it will be appreciated by those skilled in the art that the foregoing brief description and the following detailed description are exemplary and explanatory of some embodiments of the present disclosure, but are not intended to be restrictive of the present disclosure or limiting of the advantages which it can achieve in various implementations.

BRIEF DESCRIPTION OF THE DRAWINGS

Example embodiments of the present disclosure will be better understood and readily apparent to one of ordinary skill in the art from the following written description, by way of example only, and in conjunction with the drawings, in which.

DETAILED DESCRIPTION

Example embodiments described below can provide a relay with an intermediate alert mechanism and a method for intermediate alerting in association with a relay. In some example embodiments, the relay can be a solid state relay.

In example embodiments, a relay is provided with an intermediate alert mechanism. In one example embodiment, the intermediate alert mechanism can be a light emitting diode (LED) display bar that can show a visual status (voltage level) of a parameter (e.g. a voltage) of a parameter.

Figure 3A:
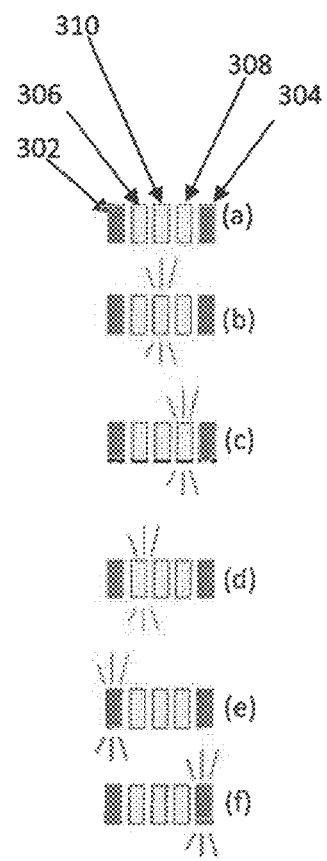
FIG. 3(a) shows a schematic diagram illustrating a display module with a plurality of light emitting diodes in an example embodiment.
Figure 3B:
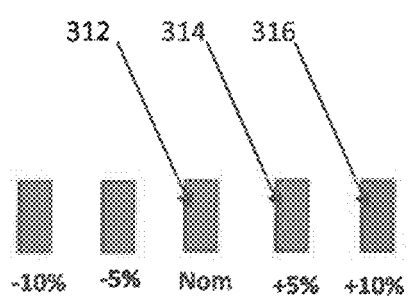
FIG. 3(b) shows another schematic diagram illustrating a display module with a plurality of light emitting diodes in an example embodiment.

In one example embodiment, a teach module can be used to instruct a relay to recognize a present detected parameter value, or the instantaneous parameter value, as a working condition for the relay. For example, if the parameter is a 3 phase power supply voltage, the teach module can instruct the relay to obtain the instantaneous voltage value as a nominal voltage working condition. The relay 100 can pre-set e.g. an under-voltage limit and an over-voltage limit using pre-defined values. For example, an under-voltage limit can be negative (−) 10% of the nominal 3 phase supply voltage and an over-voltage limit can be positive (+) 10% of the nominal value of 3 phase supply voltage. The relay 100 carries out a scaling operation such that intermediate alerts may be provided. For example, a scaling may be carried out such that an intermediate alert can be provided at (−) 5% and/or (+) 5% of the nominal voltage value. In one example embodiment, as illustrated in FIG. 3(b), a "normal" or "Nom" LED 312 is lit when the teach module is activated e.g. by the user. This indicates that the relay is learning the instantaneous 3 phase voltage value as a nominal voltage working condition. Scaling is also carried out by the relay. In such an example embodiment, as illustrated in FIG. 3(b), when the 3 phase voltage value increases to 5% more than the nominal voltage value, a +5% LED 314 is lit "ON". An intermediate trigger signal may be sent and an intermediate alert mechanism can be provided to a user. When the 3 phase voltage value increases to 10% more than the nominal voltage value, a +10% LED 316 is lit "ON". This matches the set over-voltage limit and indicates that a fault condition is met. A trigger signal may then be sent, for example, a trigger module may de-energise or switch off a relay switch element.

As will be appreciated by a person skilled in the art, a substantially similar operation can be carried out when the 3 phase voltage value decreases to 5% and 10% more than the nominal voltage value.

In the description herein, a relay can be an energisable coil device that can include, but is not limited to, any device that can be switched/powered on and off such as an electrical relay or other electromechanical switching devices, components or parts. An energisation event of an energisable coil device can include, but is not limited to, an electrical powering on/off of the element and/or a mechanical switching on/off of the element.

The terms "coupled" or "connected" as used in this description are intended to cover both directly connected or connected through one or more intermediate means, unless otherwise stated.

The description herein may be, in certain portions, explicitly or implicitly described as algorithms and/or functional operations that operate on data within a computer memory or an electronic circuit. These algorithmic descriptions and/or functional operations are usually used by those skilled in the information/data processing arts for efficient description. An algorithm is generally relating to a self-consistent sequence of steps leading to a desired result. The algorithmic steps can include physical manipulations of physical quantities, such as electrical, magnetic or optical signals capable of being stored, transmitted, transferred, combined, compared, and otherwise manipulated.

Further, unless specifically stated otherwise, and would ordinarily be apparent from the following, a person skilled in the art will appreciate that throughout the present specification, discussions utilizing terms such as "scanning", "calculating", "determining", "replacing", "generating", "initializing", "outputting", and the like, refer to action and processes of a instructing processor/computer system, or similar electronic circuit/device/component, that manipulates/processes and transforms data represented as physical quantities within the described system into other data similarly represented as physical quantities within the system or other information storage, transmission or display devices etc.

The description also discloses relevant device/apparatus for performing the steps of the described methods. Such apparatus may be specifically constructed for the purposes of the methods, or may comprise a general purpose computer/processor or other device selectively activated or reconfigured by a computer program stored in a storage member. The algorithms and displays described herein are not inherently related to any particular computer or other apparatus. It is understood that general purpose devices/machines may be used in accordance with the teachings herein. Alternatively, the construction of a specialized device/apparatus to perform the method steps may be desired.

In addition, it is submitted that the description also implicitly covers a computer program, in that it would be clear that the steps of the methods described herein may be put into effect by computer code. It will be appreciated that a large variety of programming languages and coding can be used to implement the teachings of the description herein. Moreover, the computer program if applicable is not limited to any particular control flow and can use different control flows without departing from the scope of the invention.

Furthermore, one or more of the steps of the computer program if applicable may be performed in parallel and/or sequentially. Such a computer program if applicable may be stored on any computer readable medium. The computer readable medium may include storage devices such as magnetic or optical disks, memory chips, or other storage devices suitable for interfacing with a suitable reader/general purpose computer. The computer readable medium may even include a wired medium such as exemplified in the Internet system, or wireless medium such as exemplified in bluetooth technology. The computer program when loaded and executed on a suitable reader effectively results in an apparatus that can implement the steps of the described methods.

The example embodiments may also be implemented as hardware modules. A module is a functional hardware unit designed for use with other components or modules. For example, a module may be implemented using digital or discrete electronic components, or it can form a portion of an entire electronic circuit such as an Application Specific Integrated Circuit (ASIC). A person skilled in the art will understand that the example embodiments can also be implemented as a combination of hardware and software modules.

Figure 1A:
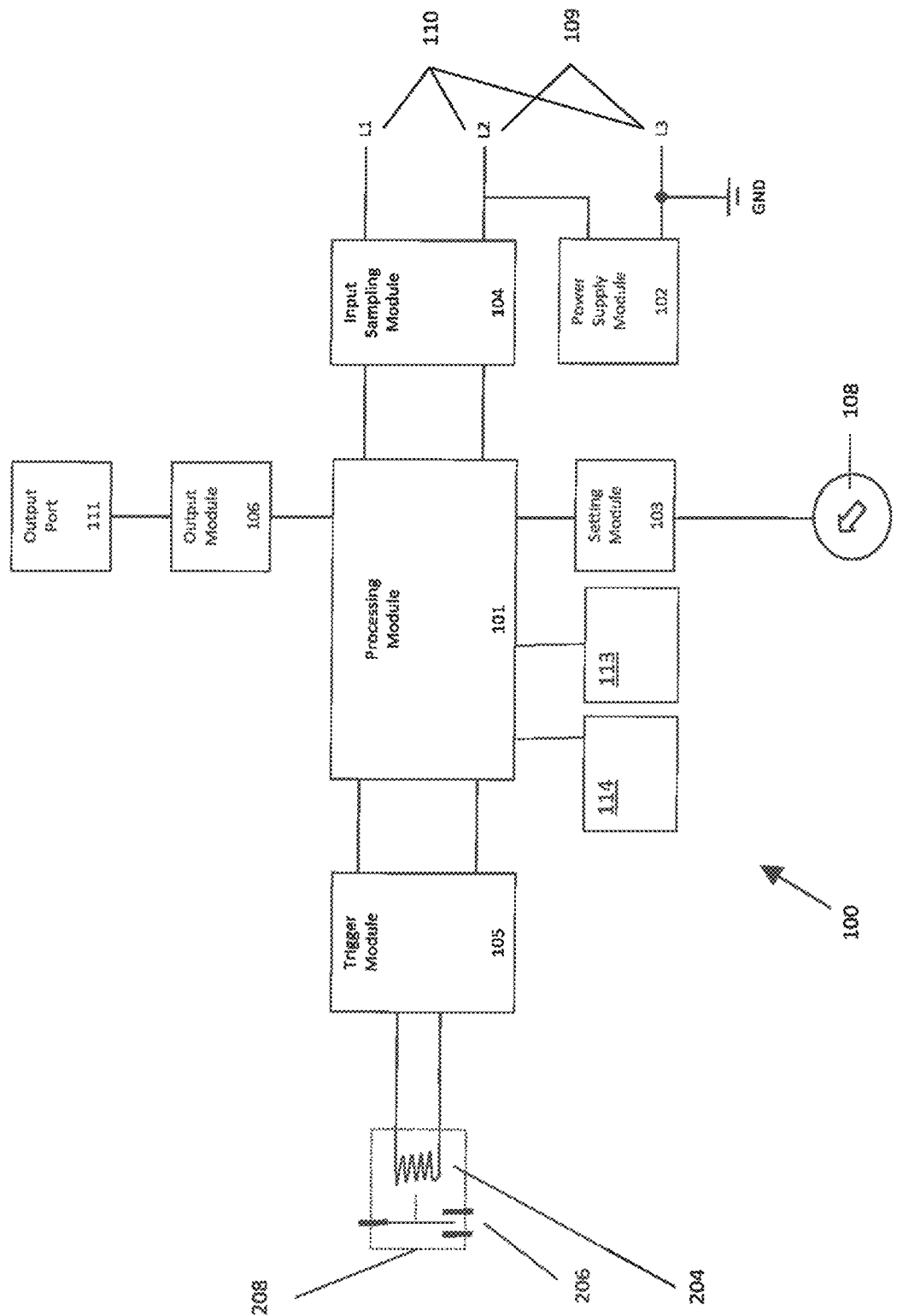
FIG. 1(a) shows a schematic diagram illustrating a relay in an example embodiment.

FIG. 1(a) shows a schematic diagram illustrating a relay in an example embodiment. In the example embodiment, the relay is a control relay 100. The relay 100 is configured to be coupled to a source to be monitored such as a three-phase power supply voltage source 110. The relay 100 can detect values of one or more parameters of the source to be monitored.

Figure 1B:
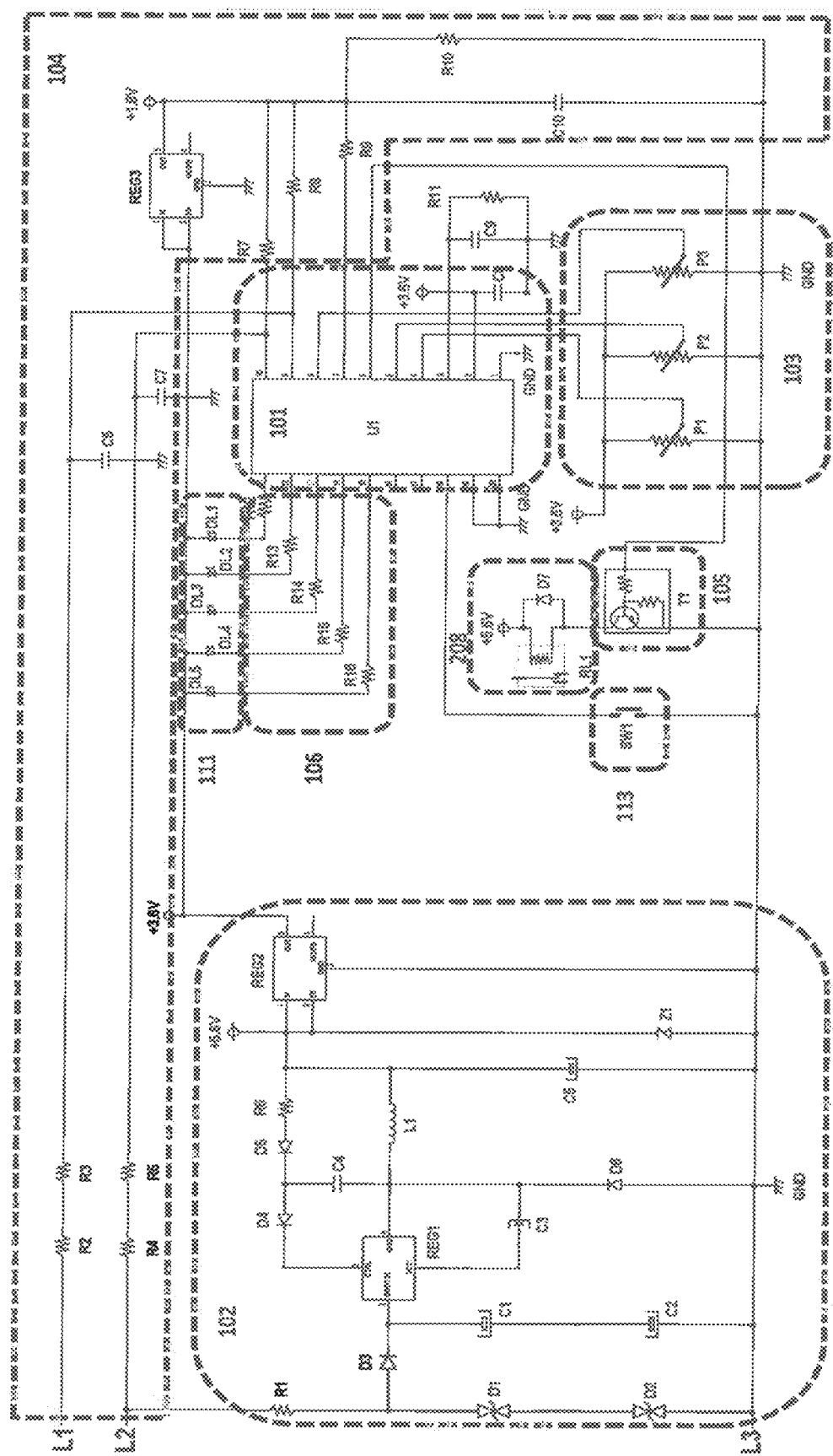
FIG. 1(b) shows a schematic circuit diagram illustrating the relay in the example embodiment.

FIG. 1(b) shows a schematic circuit diagram illustrating the relay 100 in the example embodiment.

In the example embodiment, the relay 100 comprises an input sampling module 104 coupled to a processing module 101 that is in turn coupled to an output module 106. The output module 106 is coupled to an output port 111.

The processing module 101 is also coupled to a setting module 103 that is in turn coupled to a user interface 108. The processing module 101 is further coupled to a trigger module 105 that can control a switch element 208 of the relay 100. The input sampling module 104 can couple to the source 110 using e.g. leads L1, L2, and L3. A power supply module 102 is provided to supply power to the various components of the relay 100. The relay 100 may optionally comprise a teach module 113 coupled to the processing module 101 for instructing the processing module 101 to obtain a present sensed parameter as a working condition. The relay 100 may also be coupled to a programmable logic controller 114 for feedback.

In the example embodiment as shown in FIG. 1(a), the source indicated at numeral 110 is not limited to a three-phase voltage and can include various parameters for sources to be monitored such as single phase voltage, single phase current, temperature (obtained from e.g. temperature sensors such as PT100, PTC, or from thermocouplers etc.), electrical signals associated with frequency characteristics, resistance (obtained from e.g. resistor probes for liquid level sensing), and digital signals (obtained from e.g. digital output sensors such as ultrasonic sensors, photo sensors, inductive sensors, or pressure sensors etc.). Other parameters such as phase angle or power of a three-phase power supply may also be monitored. Accordingly, the relay 100 is not limited to monitoring power source parameters but may be adapted to monitor temperature, liquid level, speed, pressure, light, and other parameters that are suitable to be monitored.

According to some embodiments as shown in FIG. 1(b), the input sampling module 104 comprises a plurality of resistors e.g. R2, R3, R4, R5, R7, R8, R9, R10 and a linear voltage regulator REG3 which regulates voltage at about 1.8V. REG3 can be implemented using e.g. TPS72118 DBVR from Texas Instruments. Capacitors e.g. C6, C7, C10 are included for noise filtering purposes. The input sampling module 104 steps down and shifts a voltage level of the 3 phase voltage from the source 110 to a voltage level suitable to be processed by the processing module 101. It will be appreciated that the sampling module 104 can have different circuit arrangements in order to adapt to various kinds of physical input parameters from different sources for monitoring at the source 110.

The processing module 101 accepts inputs from the input sampling module 104 and conducts processing. In the example embodiment, the processing module 101 can also compare a sampled parameter value (e.g. the voltage level) sampled at the input sampling module 104 with a working range for the relay 100. Optionally, the processing module 101 accepts a sampled parameter value (e.g. the voltage level) sampled at the input sampling module 104 as a working condition for the relay 100. For example, the sampled parameter value may be a voltage of 240V. In the example embodiment, the processing module 101 may set the working condition as 240V automatically. The working range is based on the working condition, as will be described later.

In the example embodiment, the processing module 101 also performs scaling operations. For example, using a working condition and one or more threshold levels, the processing module 101 applies the threshold levels to the working condition to obtain a working range. According to some embodiments, the processing module 101 proceeds to scale the working range to obtain intermediate levels within the working range. The processing module 101 automatically sets at least one intermediate level within the working range based on the threshold level. For example, if the threshold level is 5% tolerance over the working condition, an intermediate level of 2.5% over the working condition and within the working range may be set. Further intermediate levels of, for example, 1% may also be set by the processing module 101.

In the example embodiment, the output module 106 functions as a driver circuit for driving the operation of the output port 111. For example, the output module 106 accepts commands from the processing module 101 to turn on/off the output port 111. The output port 111 in the example embodiment is implemented as a display component as shown in FIG. 3(a) and FIG. 3(b). For example, the output port 111 can be a LED display to visually display or illuminate various lights, in accordance with the predetermined intermediate levels, to indicate whether a monitored 3 phase voltage level is having a tendency towards an under-voltage limit or an over-voltage limit.

The processing module 101 can comprise a microcontroller U1. U1 can be implemented using e.g. STM32F100C from STMicroelectronics or LPC1114 from NXP. Other components may be provided connected to the microcontroller as a supporting circuit to enable the microcontroller to function. It will be appreciated that the supporting circuit can be rearranged or altered depending on the type of microcontroller selected for implementation. In the example embodiment, the processing module 101 functions as an intelligent process element that interacts with the components within the relay 100. Processing in the processing module 101 is dependent on the firmware recorded in the processing module 101.

Figure 2:
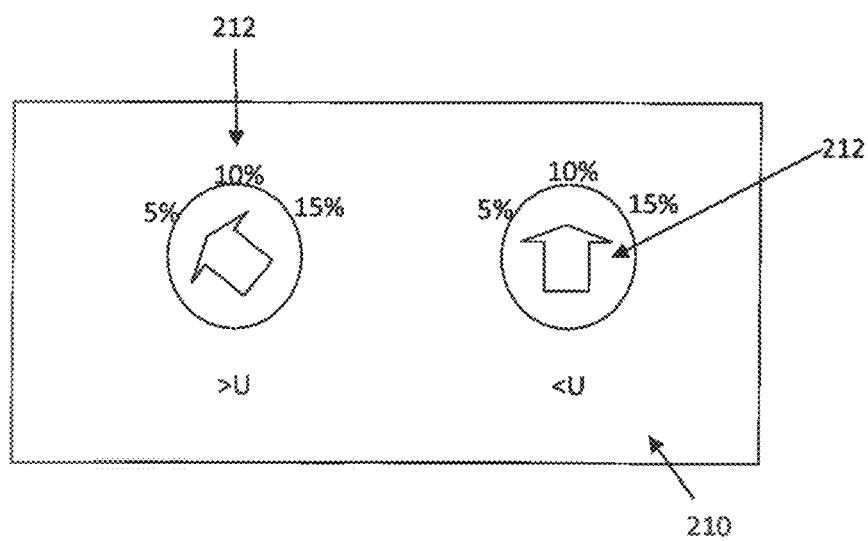
FIG. 2 shows a schematic diagram illustrating an interface allowing a user to set threshold levels in an example embodiment.

The user interface 108 can comprise external manipulated elements as shown in FIG. 2 to be accessed by a user of the relay 100. The manipulation or setting set by the user on the user interface 108 is sensed by the setting module 103 and is translated into an electrical signal at the setting module 103. The signal is transmitted to the processing module 101 for processing at the processing module 101.

A plurality of types of manipulation or settings may be used depending on the type of relay 100. According to some embodiments, manipulation or setting can include voltage range selection setting, under-voltage setting, over-voltage setting and etc. Asymmetry setting can be included as well. Asymmetry setting includes different tolerance between a high level and a low level. In an alternative example embodiment, for a relay 100 that monitors frequency as a physical input type, manipulation or setting to be done by a user can include under-temperature setting, over-temperature setting and etc. The settings set via the user interface 108 provide one or more threshold levels or "sets of conditions" that the relay 100 uses at the processing module 101 in order to determine whether the parameter values sampled at the source 110 fall within a working range based on these "sets of conditions".

In the example embodiment as shown in FIG. 1(b), the setting module 103 comprises a plurality of converters such as potentiometers P1, P2, and P3 for converting the setting set by the user at the user interface 108 to an electrical signal that can be transmitted and recognized by the processing module 101. According to an embodiments, the plurality of converters work coordinately with each other and each has a dedicated function. For example, P1 can translate a selection of nominal voltage range selected by the user (e.g. 200V, 220V, 380V, 400V, 440V, and 480V); P2 can translate an over-voltage user setting; and P3 can translate an under-voltage user setting. It will be appreciated that the setting module 103 is not limited as such and can be expanded to more settings such as asymmetry, time setting and etc.

Therefore, in the example embodiment, the processing module 101 can set a working condition based on input from the input sampling module 104 and the processing module 101 can set a working range based on applying the one or more threshold levels to the working condition, the threshold levels supplied via the setting module 103. The processing module 101 can scale the working range to obtain intermediate levels within the working range. If a monitored value of the parameter of the source to be monitored reaches an intermediate level, an intermediate trigger signal is transmitted. The intermediate trigger signal can be transmitted by the processing module 101 instructing a LED showing an intermediate alert, such as certain pre-determined LEDS to be lit. If a monitored value of the parameter of the source to be monitored falls outside the working range, a trigger signal is transmitted. The trigger signal can be transmitted by the processing module 101 instructing the trigger module 105 to control the switch element 108. A LED showing a fault can also be lit to indicate the fault.

The trigger module 105 comprises a controlling unit coupled with a switch. For example, as shown in FIG. 1(b), the trigger module comprises a transistor T1 for driving or controlling the switch element 208. In the example embodiment, when T1 is turned ON, the switch element 208 is energized or switched on. When T1 is turned OFF, the switch element 208 is de-energized or switched off. It will be appreciated that there are various possibilities to modify the design and/or to reverse the above logic depending on designer preference. The trigger signal can be a feedback signal to a programmable logic controller 114 for alerting the user.

In the example embodiment, the switch element 208 can be constructed as an electro-mechanical relay switch. The switch element 208 comprises a coil portion 204 and a contact portion 206 as shown in FIG. 1(a). The coil portion 204 can be energized or de-energized by the trigger module 105 in order to switch the position or logic of the contact portion 206. It will be appreciated that the switch element 208 can be any of electro-mechanical relay or solid-state switch.

In the example embodiment, the power supply module 102 functions as a power supply circuit of the relay 100. The power supply module 102 steps down and regulates an external power supply 109 provided to the relay 100 to a voltage supply level that is suitable for the components in the relay 100. In the example embodiment, the power supply module 102 comprises a switching regulator integrated circuit REG1. REG1 can be implemented using e.g. NCP1052ST44T3G from ON Semi. Diodes D3, D6, an inductor L1, zener diode Z1, and capacitors C5, C1, C2 provide a construction of a buck-converter. Diodes D4, D5, resistor R6, and capacitor C4 function as a feedback circuit for REG1, and functions to sample a regulated output voltage at about +5.6V in order to be able to achieve a voltage regulation purpose. A capacitor C3 is provided as a start-up element for REG1 when the power supply is initially provided to the relay 100. A resistor R1 and diodes D1, D2 function as a circuit for transient voltage protection. The power supply module 102 also comprises a linear voltage regulator REG2 which regulates voltage at about 3.6V. REG2 may be implemented as e.g. 3.6V voltage regulator LD2981ABM36TR from STMicroelectronics.

With reference to FIG. 1(a), numeral 109 at leads L2, L3 denotes an external source of supply voltage for the relay 100. In this example of FIG. 1, the source of supply voltage to the power supply module 102 is the same physical input as that coupled to the input sampling module 104 (i.e. at leads L2, L3). However, it will be appreciated that it is not necessary that the source of supply voltage to be the same as the input to the relay 100.

As described, a teach module 113 can be optionally included in the relay 100. The teach module 113 can be provided for instructing the processing module 101 to obtain a present sensed parameter value as a working condition. In such a scenario, the processing module 101 ignores previously sensed values and sets a working condition. It will be appreciated that the teach module 113 can be any electronics or electro-mechanical switch that functions to e.g. reset the processing module 101. The teach module 113 can be activated by a user as an instructional input to instruct the processing module 101. In some example embodiments, the teach module may be provided as an actuator such as a button for the user.

It will be appreciated that the teach module 113 can be excluded in alternative example embodiments whereby the relay 100 automatically recognises and/or memorises a detected parameter value obtained each time the relay 100 is powered up as the working condition. Accordingly, each initial detection of a power supply to the relay acts as an instructional input to instruct the processing module 101 to set the initialed detected value as the working condition.

In the example embodiment, optionally, a storage element or memory (not shown) may be provided. The memory can store all the information related to the parameters detected at the input sampling module 104. For example, the memory can store all instantaneous information of a 3 phase voltage, the information including instantaneous voltage level, historical voltage level, frequency, historical faults that had happened and etc. The memory can be, but not limited to, an external memory module such as EEPROM, FLASH, PROM and etc., or an integrated memory circuit embedded into the processing module 101.

Therefore, in the example embodiment, the relay 100 can function as a control & monitoring device for monitoring physical input parameters and for automatically detecting the condition of the physical input parameters, i.e. whether the parameters are meeting one or more threshold levels set by a user. The relay 100 can reflect that status in various terms, such as a digital form/feedback or a visual feedback. This may be a trigger signal in terms of "closing a contact" or "opening a contact" if the switch element 208 is an electro-mechanical relay or in terms of "ON" or "OFF" if the switch element 208 is a solid-state switch. The relay 100 can be powered by a separate source of supply voltage or share the same source of supply voltage as the physical input parameters of the source to be monitored. In the example embodiment, the power source is preferably a three phase power source, although other kinds of power sources may also be used. It will be appreciated that the power source may be either an alternating current (AC) or direct current (DC) power.

FIG. 2 shows a schematic diagram illustrating an interface allowing a user to set threshold levels in an example embodiment. The interface 210 comprises one or more setting elements such as one or more potentiometers e.g. 212. The user can manipulate a potentiometer e.g. 212 for setting a threshold such as an overvoltage of about 5%, 10%, or 15%. Thus, if the monitored voltage at numeral 110 exceeds 5% of the normal working condition, a fault needs to be reported.

In an example embodiment, after a working range and the intermediate levels within the working range have been set, the processing module continues to monitor values of the parameter sampled at the input sampling module and compare them with the working range. If the monitored value reaches an intermediate level set by the processing module 101, the processing module 101 instructs the transmission or sending of an intermediate trigger signal. The intermediate trigger signal can be transmitted to the output module to, for example, drive the output port to activate a light emitting diode (LED) for intermediate alerting to the user. The intermediate trigger signal may also be sent to a programmable logic controller 114 for further processing.

In the example embodiment, if the monitored value continues to departure from the working condition and becomes outside the working range, a fault needs to be reported. The monitoring module 108 can send a trigger signal via the trigger module 105. In the example embodiment, the trigger module 105 is capable of energising/de-energising the switch element 208 to switch on/off a switch of the relay. This trigger signal can be a feedback signal to a programmable logic controller 114 for alerting the user of a fault. In addition, the trigger signal can also be transmitted to the output module 106 to, for example, drive the output port to activate a light emitting diode (LED) for alerting the user of a potential fault. For example, the trigger signal can be transmitted to a light emitting diode (LED) circuit that instructs an LED to be lit when a corresponding parameter is detected to have a value outside its determined working range. For example, an overvoltage LED may be lit if a detected voltage level is determined to be outside e.g. a 5% tolerance from a working condition for the voltage and an overcurrent LED may be lit if a detect current level is determined to be outside e.g. 2% tolerance from a working condition for the current.

FIG. 3(a) shows a schematic diagram illustrating a display module with a plurality of light emitting diodes in an example embodiment. The display module can be an example implementation of the output port 111. In the example embodiment, the display module comprises a plurality of light emitting devices such as five light emitting diodes (LEDs) (302, 304, 306, 308, and 310) or light bulbs. According to some embodiments, the five LEDs are arranged so that the LEDs at outer sides indicate a fault at a high level and a low level, the LED at the center indicates a proper working situation, and the LEDs between the outer sides and the center indicate intermediate levels. As shown in 3(a) of FIG. 3(a), two red LEDs 302, 304 are provided for fault alerting, two yellow LEDs 306, 308 are provided for intermediate alerting and a yellow LED 310 for working condition indication. In the example embodiment, the working range is set at 30% both above and below the working condition. The processing module (compare 101 from FIGS. 1(a) and 1(b)) scales and sets the intermediate levels as 15% above and below the working condition. As shown in 3(b), the LED 310 is lit when the detected value of the parameter is still below the intermediate levels.

As shown in 3(c), the LED 308 is lit when the detected value of the parameter is above the upper intermediate level (i.e. above 15% from the working condition) but still below the upper fault/trigger level (30% from the working condition). This can be, for example, a situation whereby a detected voltage is approaching, but yet not at, an overvoltage condition. LED 308 that is between the LED 304 at the high end and the LED 310 at the center is lit to indicate a raised voltage level. As shown in 3(*d*), the LED 306 is lit when the detected value of the parameter is below the lower intermediate level (i.e. below 15% from the working condition) but still above the lower fault/trigger level (30% from the working condition). This can be, for example, a situation whereby a detected voltage is approaching, but yet not at, an undervoltage condition.

As shown in 3(*e*), the fault LED 302 is lit when the detected value of the parameter is outside the working range (i.e. below 30% from the working condition). This can be, for example, a situation whereby a detected voltage is at an undervoltage condition. Simultaneously, the switch element (compare 208 from FIGS. 1(*a*) and 1(*b*)) can be switched on/off as a trigger signal. As shown in 3(*f*), the fault LED 304 is lit when the detected value of the electrical characteristic is outside the working range (i.e. above 30% from the working condition). This can be, for example, a situation whereby a detected voltage is at an overvoltage condition. Simultaneously, the switch element (compare 208 from FIGS. 1(*a*) and 1(*b*)) can be switched on/off as a trigger signal.

FIG. 3(*b*) is another schematic diagram illustrating a display module with a plurality of light emitting diodes in an example embodiment.

In the example embodiments, the working condition can be detected automatically, for example, at each powering-up of the relay 100. Alternatively, the working condition can be pre-set, for example, by the manufacturer of the relay 100. Alternatively, the working condition can be set by the user.

In one example embodiment, the working condition information may be stored in a storage member coupled to the processing module such as a random access memory (RAM) chip. Thus, the working condition information can be stored for future use. Alternatively or in addition, an actuator such as a button can be provided so that a user can manipulate the actuator to send an instructional input for instructing the processing module to access the current detected parameter value for determining/setting the working condition for the processing module, and to disregard any previous stored working condition information. As yet another alternative, the processing module can be instructed to determine/set the working condition at each powering-up of the relay 100, that is, each initial detection of a power supply to the relay acts as an instructional input to instruct the processing module.

Thus, in the described example embodiment, the relay is capable of generating a working range based on applying a threshold level to a working condition. The working range can be scaled by the relay to set one or more intermediate levels. If a detected value of a parameter reaches the intermediate level, an intermediate trigger signal can be sent from the relay. This may include a visual indication to the user.

In another example embodiment, a relay can be provided that functions substantially identical to the relay 100 in FIGS. 1(*a*) and 1(*b*). However, in this example embodiment, the threshold levels are set automatically and stored in a storage module, i.e. predetermined threshold levels. The stored values may be in the form of a lookup table. In this example embodiment, a pre-set tolerance may be provided for each expected value of a parameter of the source to be monitored. For example, it may be stored that for 240V set as a working condition, the pre-set tolerance for overvoltage may be 5% and for 300V set as a working condition, the pre-set tolerance for overvoltage may be 10% etc.

Figure 5:
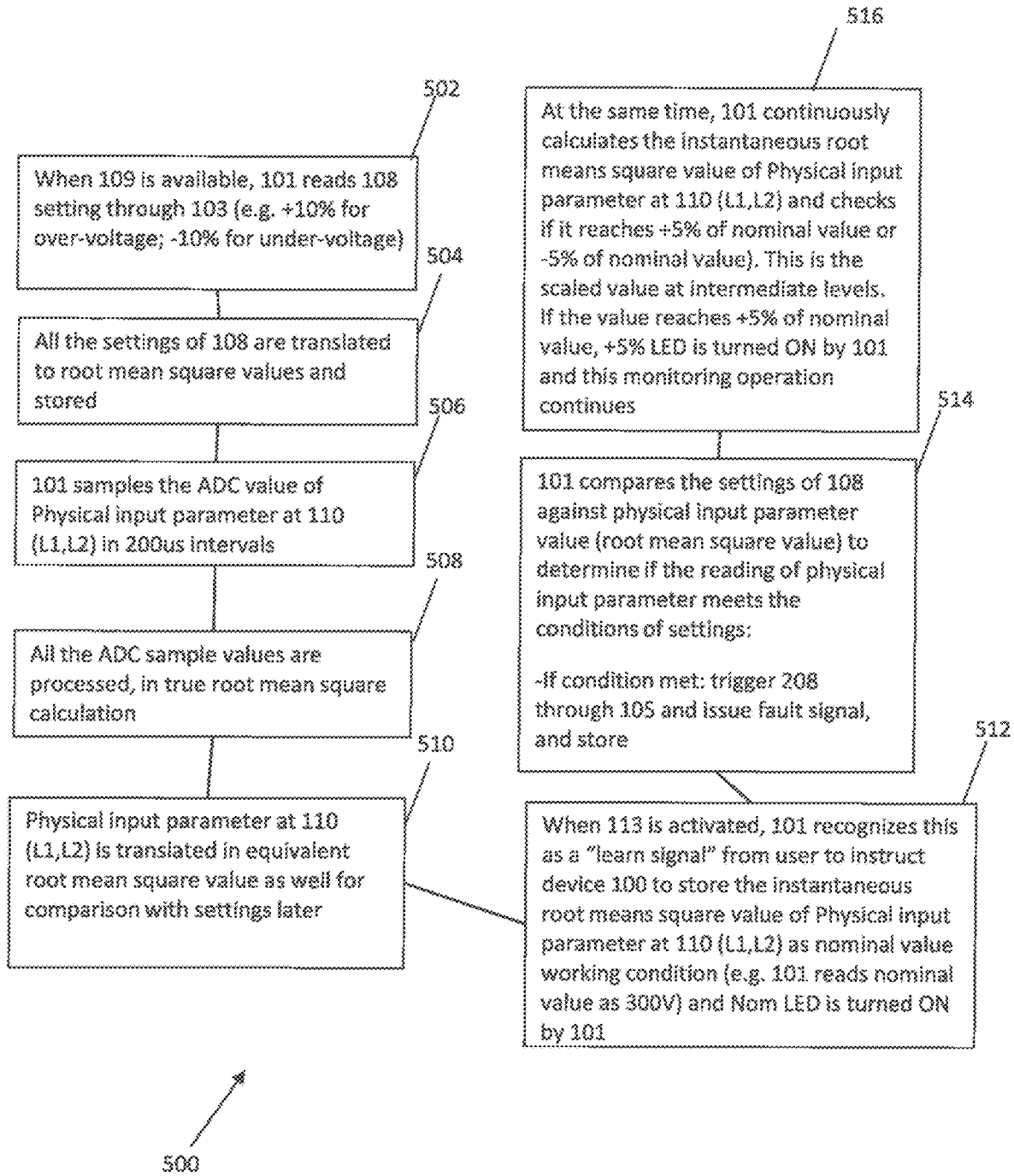
FIG. 5 shows a schematic flow diagram for broadly illustrating an algorithm of an exemplary firmware for the processing module of FIGS. 1(a) and 1(b) in an example embodiment.

FIG. 5 shows a schematic flow diagram 500 for broadly illustrating an algorithm of an exemplary firmware for the processing module 101 of FIGS. 1(*a*) and 1(*b*) in an example embodiment. At step 502, when a power supply (at numeral 109) is available to the relay 100, the processing module 101 reads the user interface 108 settings through the setting module 103 (e.g. a symmetrical setting may include +10% for over-voltage; −10% for under-voltage or asymmetrical setting may include +5% for over-voltage and −10% for under-voltage). At step 504, the settings from the user interface 108 are translated to root mean square values and stored. At step 506, the processing module 101 samples the analog to digital conversion (ADC) value of the detected parameter value through the input sampling module 110 (L1,L2) in 200 uS intervals. At step 508, the ADC sample values are processed, in true root mean square calculations. At step 510, the parameter value at numeral 110 (L1,L2) is translated in equivalent root mean square value as well for comparison with the settings later.

At step 512, when it is detected that the teach module 113 is activated, the processing module 101 recognizes the activation as a "learn signal" from a user to instruct the relay 100 to store the instantaneous root means square value of the parameter value obtained through the input sampling module 110 (L1,L2) as a nominal value working condition (e.g. the processing module 101 reads nominal value as 300V) and a Nom LED (compare 312 of FIG. 3(*b*)) is turned ON by the processing module 101. At step 514, the processing module 101 compares the settings of the user interface 108 with the detected parameter value (root mean square value) to determine if the reading of the parameter meets the conditions of the settings: At step 516, at the same time, the processing module 101 continuously calculates the instantaneous root mean square value of the parameter value obtained through the input sampling module 110 (L1,L2) and checks if it reaches +5% of nominal value or −5% of nominal value). This is the exemplary scaled value at intermediate levels as determined by the processing module 101. If the value reaches +5% of nominal value, +5% LED (compare 314 of FIG. 3(*b*)) is turned ON by the processing module 101 and this monitoring operation continues. If a condition of step 514 is met, the switch element 208 is triggered through the trigger module 105 and a fault signal is issued/transmitted, and can be stored.

Figure 4:
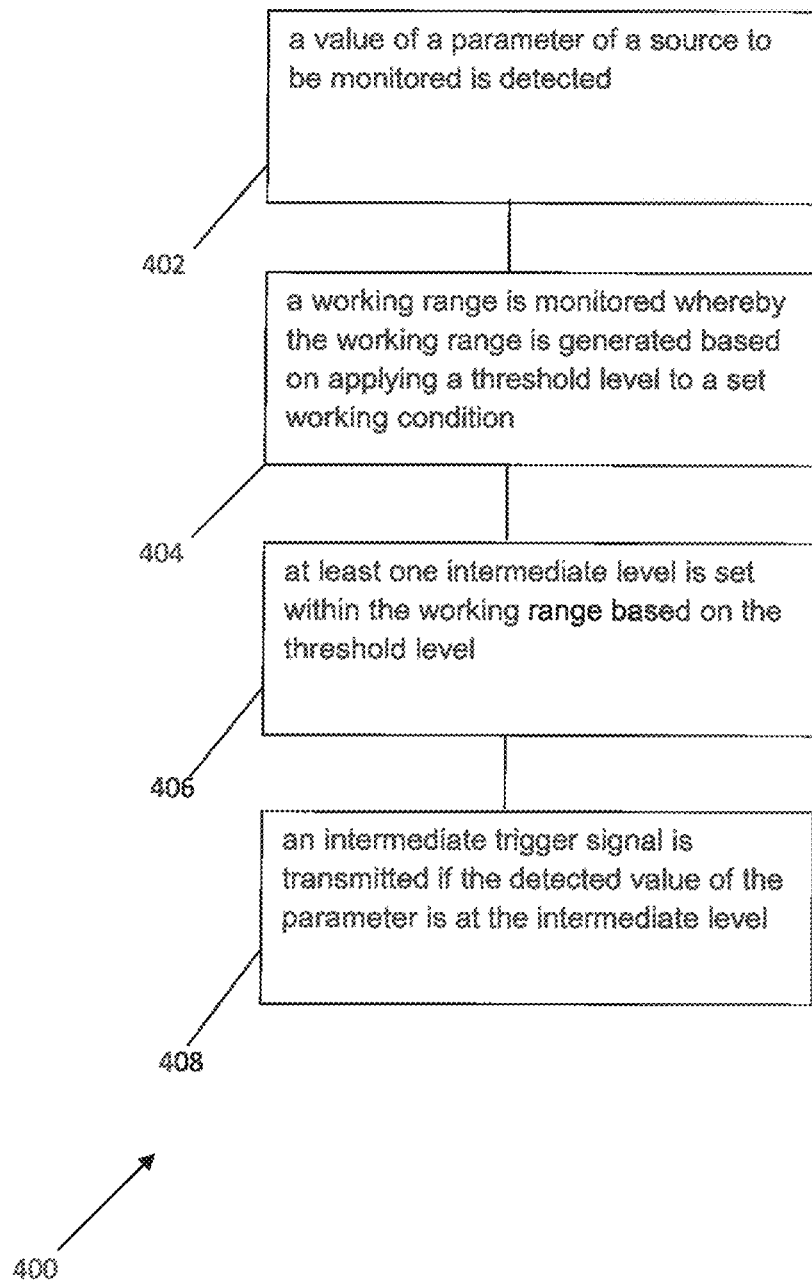
FIG. 4 shows a schematic flowchart illustrating a method for intermediate alerting in association with a relay in an example embodiment.

FIG. 4 shows a schematic flowchart 400 illustrating a method for intermediate alerting in association with a relay in an example embodiment. At step 402, a value of a parameter of a source to be monitored is detected. At step 404, a working range is monitored whereby the working range is generated based on applying a threshold level to a set working condition. At step 406, at least one intermediate level is set within the working range based on the threshold level. At step 408, an intermediate trigger signal is transmitted if the detected value of the parameter is at the intermediate level.

In the above described example embodiments, one or more intermediate alerts can be provided to a user in that the user is made aware that the relay is advancing toward fault. This can enable the user to take preventive measures instead of only being aware of a fault once that fault has occurred. Thus, the indication provided can assist a user to know the changing trend of the parameters being monitored. This may improve user satisfaction. The inventors have recognised that the described example embodiments can be applied to control relays such that a larger number of users can be attracted to using such devices.

In the above example embodiments, LEDs are described as providing visual indications to the user. However, it will be appreciated that the example embodiments are not limited as such and can include other forms of indications, for example, a liquid crystal display (LCD) screen that can display the actual values of the monitored parameters and showing advancement of the parameter values toward faults; or an audio alert system sounding different alerts to the user at different intermediate/trigger levels etc.

It will be understood, however, that the present invention may be practiced without necessarily providing one or more of the advantages described herein or otherwise understood in view of the disclosure and/or that may be realized in some embodiments thereof. It will be appreciated by a person skilled in the art that other variations and/or modifications may be made to the specific embodiments without departing from the spirit or scope of the invention as broadly described. The present embodiments are, therefore, to be considered in all respects to be illustrative and not restrictive. The present embodiments are, therefore, to be considered in all respects as illustrative and not restrictive of the present invention, which should be defined in accordance with the claims that follow.

What is claimed is:

1. A relay comprising:
an input sampling module configured to detect a parameter of a source to be monitored;
a processing module configured to determine a working range based on a threshold level and a working condition, the processing module further configured to automatically determine at least one intermediate level within the working range based on the threshold level, and to automatically determine the working condition based on a detected value of the parameter of the source by the input sampling module during a learning mode capable of being selectively activated by a user at a time while the relay is in a powered up state, wherein each at least one intermediate level is between the working condition and one of an upper limit of the working range and a lower limit of the working range;
wherein the processing module is configured to cause an intermediate trigger signal to be transmitted when a detected value of the parameter departs from the working condition and reaches the intermediate level at a time not during the learning mode;
wherein the processing module is configured to cause transmission of a trigger signal for switching on or switching off a switch element (i) when a detected value of the parameter is determined by the processing module to be greater than the upper limit of the working range, and (ii) when a detected value of the parameter is determined by the processing module to be less than the lower limit of the working range, at a time not during the learning mode; and
wherein the processing module is configured such that transmission of the trigger signal for switching on or switching of the switch element is not transmitted when the intermediate trigger signal is caused to be transmitted.

2. The relay as claimed in claim 1, wherein the parameter comprises one or more parameters selected from a group consisting of three phase voltage, single phase voltage, single phase current, phase angle, phase frequency, power, temperature, resistance, and digital signals.

3. The relay as claimed in any one of claim 1, wherein the intermediate trigger signal produces an alert.

4. The relay as claimed in claim 3, wherein the alert comprises a visual alert, an audio alert or both.

5. The relay as claimed in claim 4, wherein the visual alert comprises lights illuminated by a light emitting diode (LED).

6. The relay as claimed in claim 1, wherein the threshold level is set by the user.

7. The relay as claimed in claim 1, wherein the processing module is configured to determining the working condition based on a detected value of the parameter during a powering up of the relay.

8. The relay as claimed in claim 1, wherein the relay comprises the switch element.

9. The relay as claimed in claim 1, wherein the processing module is capable of automatically setting a plurality of intermediate levels.

10. A method for producing an intermediate alert in association with a relay, the method comprising,
detecting a parameter of a source to be monitored;
automatically determining a working condition based on a detected value of the parameter of the source during a learning mode selectively activated by a user at a time while the relay is in a powered up state;
determining a working range based on a threshold level and the working condition;
automatically determining at least one intermediate level within the working range based on the threshold level, wherein each at least one intermediate level is between the working condition and one of an upper limit of the working range and a lower limit of the working range;
transmitting an intermediate trigger signal when a detected value of the parameter at a time not during the learning mode departs from the working condition and reaches the intermediate level; and
transmitting a trigger signal from the relay (i) when a detected value of the parameter at a time not during the learning mode is greater than the upper limit of the working range, and (ii) when a detected value of the parameter at a time not during the learning mode is determined by the processing module to be less than the lower limit of the working range, the trigger signal causing switching on or switching off of a switch element, wherein transmission of the trigger signal for switching on or switching of the switch element is not transmitted when the intermediate trigger signal is transmitted.

11. The method as claimed in claim 10, wherein the parameter comprises one or more parameters selected from a group consisting of three phase voltage, single phase voltage, single phase current, phase angle, phase frequency, power, temperature, resistance, and digital signals.

12. The method as claimed in any one of claim 10, wherein the intermediate trigger signal produces an alert.

13. The method as claimed in claim 12, wherein the alert comprises a visual alert, an audio alert or both.

14. The method as claimed in claim 13, wherein the visual alert comprises lights illuminated by a light emitting diode (LED).

15. The method as claimed in claim 10, wherein the threshold level is set by the user.

16. The method as claimed in claim 10, wherein the working condition is determined based on an instructional input that is based on a powering up of the relay.

17. The method as claimed in claim 10, wherein the relay comprises the switch element.

18. The method as claimed in claim 10, wherein the automatically determining at least one intermediate level step comprises automatically setting a plurality of intermediate levels within the working range based on the threshold level.

19. A non-transitory computer readable data storage medium having stored thereon computer code for instructing a processing module of a relay to execute a method for producing an intermediate alert, the method comprising:
   detecting a parameter of a source to be monitored;
   automatically determining a working condition based on a detected value of the parameter of the source during a learning mode selectively activated by a user at a time while the relay is in a powered up state;
   determining a working range based on a threshold level and the working condition;
   automatically determining at least one intermediate level within the working range based on the threshold level, wherein each at least one intermediate level is between the working condition and one of an upper limit of the working range and a lower limit of the working range;
   transmitting an intermediate trigger signal when a detected value of the parameter at a time not during the learning mode departs from the working condition and reaches the intermediate level; and
   transmitting a trigger signal from the relay (i) when a detected value of the parameter at a time not during the learning mode is greater than the upper limit of the working range, and (ii) when a detected value of the parameter at a time not during the learning mode is determined by the processing module to be less than the lower limit of the working range, the trigger signal causing switching on or switching off of a switch element, wherein transmission of the trigger signal for switching on or switching of the switch element is not transmitted when the intermediate trigger signal is transmitted.

20. The non-transitory computer readable data storage medium as claimed in claim 19, wherein the automatically determining at least one intermediate level step of the method comprises automatically setting a plurality of intermediate levels within the working range based on the threshold level.

\* \* \* \* \*